(12) United States Patent
Ruff et al.

(10) Patent No.: US 7,053,643 B2
(45) Date of Patent: May 30, 2006

(54) RADIO FREQUENCY (RF) TEST PROBE

(75) Inventors: Charles Ruff, Hillsboro, OR (US); David J. Webster, San Marcos, CA (US)

(73) Assignee: Intel Corporation, Santa Clara, CA (US)

(*) Notice: Subject to any disclaimer, the term of this patent is extended or adjusted under 35 U.S.C. 154(b) by 30 days.

(21) Appl. No.: 10/811,128

(22) Filed: Mar. 25, 2004

(65) Prior Publication Data

US 2005/0212541 A1    Sep. 29, 2005

(51) Int. Cl.
*G01R 31/02* (2006.01)
(52) U.S. Cl. .................... 324/761; 324/72.5
(58) Field of Classification Search ......... 324/754–762
See application file for complete search history.

(56) References Cited

U.S. PATENT DOCUMENTS

| | | | |
|---|---|---|---|
| 4,388,591 A * | 6/1983 | Lannan | 324/754 |
| 4,801,274 A * | 1/1989 | Royce | 439/322 |
| 5,945,835 A | 8/1999 | McDonough et al. | |
| 5,969,535 A * | 10/1999 | Saito | 324/758 |
| 6,135,799 A * | 10/2000 | Lincoln | 439/320 |
| 6,281,690 B1 | 8/2001 | Frey | |
| 6,753,676 B1 | 6/2004 | Myer | |

FOREIGN PATENT DOCUMENTS

| | | | |
|---|---|---|---|
| EP | 565943 A2 * | 10/1993 |
| JP | 04188080 A * | 7/1992 |
| JP | 07050324 A * | 2/1995 |
| JP | 07311220 A * | 11/1995 |
| JP | 08294450 A * | 11/1996 |
| JP | 10221368 A * | 8/1998 |
| JP | 2001001659 A * | 1/2001 |
| JP | 2001004659 A * | 1/2001 |
| JP | 2004227948 A * | 8/2004 |

* cited by examiner

*Primary Examiner*—Paresh Patel
(74) *Attorney, Agent, or Firm*—Schwabe, Williamson & Wyatt, P.C.

(57) ABSTRACT

A test probe apparatus having a housing and a probe pin is provided. The housing includes a first housing end portion having a round tapered wall defining a tapered cavity. The probe pin includes a pin base portion rigidly mounted to the housing and a pin tip portion movably mounted to the housing for movement between a first position and a second position. At the first position, the pin tip portion is disposed in a spaced-apart relationship with the pin base portion and protrudes into the tapered cavity. At the second position, the pin tip portion is moved toward the pin base portion relative to the first position.

13 Claims, 7 Drawing Sheets

RADIO FREQUENCY (RF) TEST PROBE

BACKGROUND OF THE INVENTION

1. Field of the Invention

The present invention relates to electronic devices, and in particular, to test equipment for electronic devices.

2. Description of Related Art

A radio frequency (RF) test probe may be used in manual testing or automated production testing to facilitate test measurements and tuning of wireless devices, and in particular, RF integrated circuits contained on printed circuit boards (PCBs) or cards in such wireless devices. One example of such a wireless device may be a mini-PCI (Peripheral Component Interconnect) WLAN (Wireless Local Area Network) card. Generally, this WLAN card may be described as a specific type of network interface card (NIC). The WLAN NIC provides the hardware and firmware for transmitting and receiving data to and from the wireless device.

Typically, the WLAN card has mounted thereon a coaxial connector. The test probe is attached to the coaxial connector, so that automated or manual test fixtures may be temporarily coupled to the WLAN card for testing and tuning. With the prior-art RF test probe, a test adapter is manually snapped onto the coaxial connector. These coaxial connectors may have a life of only about 100 insertions (i.e., attachments), which results in frequent replacement. One reason for this frequent replacement of the coaxial connectors is that the coaxial connector used on the WLAN card has a soft, tin plated coating. The prior-art test adapter pulls metal flakes from the coaxial connector during the removal of the test probe. These metal flakes may detrimentally be deposited onto the WLAN card and sometime into the test probe, which in turn may cause intermittent electrical connections, potential electrical shorts, and tester down times for repair.

DETAILED DESCRIPTION OF ILLUSTRATIVE EMBODIMENTS

In the following description, for purposes of explanation, numerous details are set forth in order to provide a thorough understanding of the disclosed embodiments of the present invention. However, it will be apparent to one skilled in the art that these specific details are not required in order to practice the disclosed embodiments of the present invention. In other instances, well-known electrical structures and circuits are shown in block diagram form in order not to obscure the disclosed embodiments of the present invention.

Figure 1:
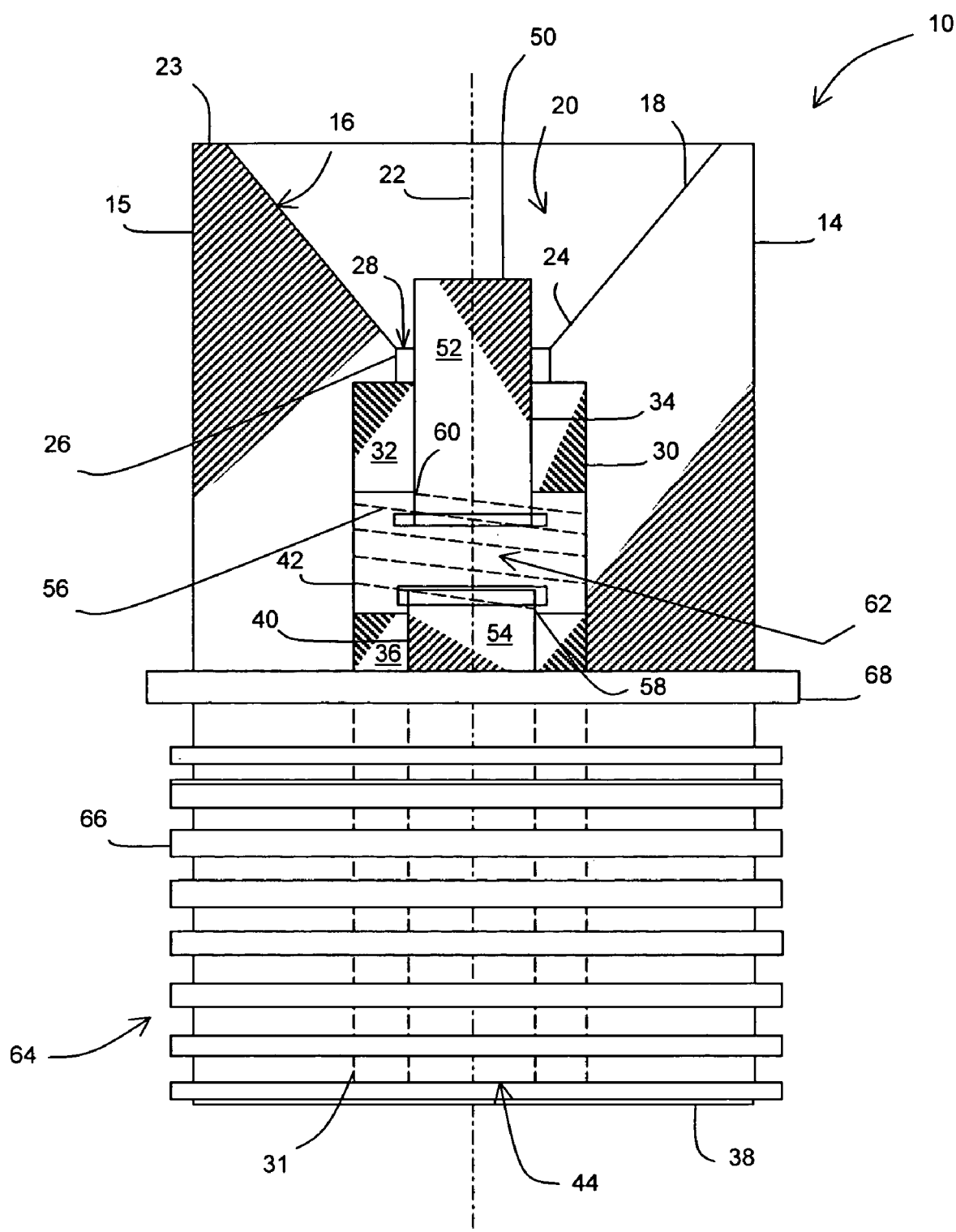
FIG. 1 is a side view of a test probe in accordance to one embodiment of the present invention.
Figure 2:
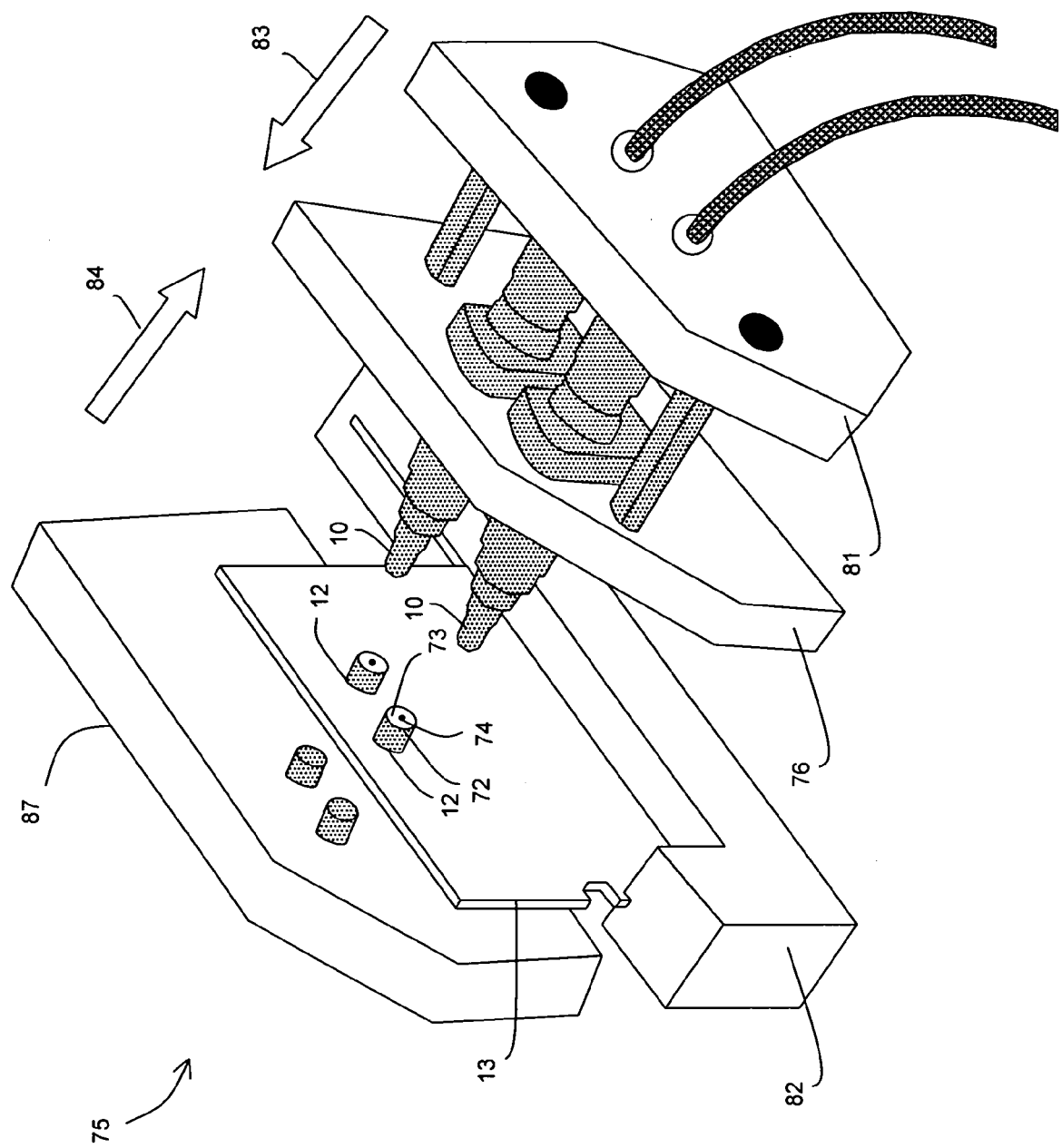
FIG. 2 is a perspective view of a test fixture in accordance to one embodiment of the present invention wherein the test probe of FIG. 1 is applied to a coaxial connector of a wireless device.

With reference to FIG. 1, a test probe 10, in accordance with one embodiment of the present invention, is shown. The test probe 10 may be used with automated, semi-automated and manual test fixtures for probing a coaxial connector attached, for example, to a Radio Frequency (RF) or wireless device during a calibration and/or testing phase in the production of the wireless device, prior to packaging and shipping the wireless device to an end customer. With reference to FIG. 2, a coaxial connector 12 is shown which is connected to a wireless device 13, such as a mini-PCI WLAN card. The coaxial connector 12 may be of the type identified in the industry as an Ultra Miniature Low Profile Lightweight SMT (surface mounted technology) Coaxial Connectors, in accordance with an IEEE 802.11 standard, which was developed for mini-PCI applications to service 2.4 GHz and 5 GHz applications for Wireless LAN. However, the test probe 10 may be sized to fit other connectors. In general, the test probe 10 of FIG. 1 may provide a mechanism for connecting to any device, such as a RF or wireless device 13 of FIG. 2, which uses a coaxial connector 12.

Referring to FIG. 1, the test probe 10 may have a cylindrically-configured probe housing 14 with an outer housing body 15. The housing body 15 may be made of metal and may be coupled to an electrical ground. The housing body 15 may include a first end portion 16, which has an interior, round, inwardly-tapered wall 18 that defines a tapered cavity 20. More specifically, the tapered cavity 20 (and therefore the wall 18) may have a configuration of a conical frustum. Geometrically, a conical frustum shape is created by slicing the top off a cone, with the plane of the cone's cut being parallel to the plane of the cone's base, i.e., a truncated cone with parallel, opposed planar surfaces. The inwardly tapered wall 18 defines a tapered electrically grounding surface. The tapered wall 18 tapers inwardly towards a center axis 22 of the test probe 10.

The first end portion 16 may have a planar ring-like surface 23 at its outmost extremity. The tapered wall 18 may start at an inner periphery of the ring-like surface 23 and may terminate on an inner edge of an annular-shaped ledge 24. The inner edge of the ledge 24 is defined by a cylindrical, first internal wall portion 26. The first internal wall portion 26 forms a cylindrical first channel portion 28. A cylindrical, second internal wall portion 30 may extend along the remainder of the longitudinal axis of the housing body 15. The two internal wall portions 26 and 30, when combined, will be referred to as the "internal wall" of the housing 14. The internal wall forms a passageway 31 within the housing body 15, which extends from the tapered cavity 20 to the end of the test probe 10.

An insulating first sleeve portion 32 is positioned inside of the second internal wall portion 30, with the first sleeve portion 32 extending from the ledge 24 to a position part way down the second internal wall portion 30 in the passageway 31. The first sleeve portion 32 forms a cylindrical second channel portion 34. An insulating second sleeve portion 36 also is positioned inside of the second internal wall portion 30, with the second sleeve portion 36 extending from a bottom 38 of the test probe 10 to a position part way up the second internal wall portion 30 in the passageway 31. The first sleeve portion 32 is proximally located with respect to the tapered cavity 20 in the passageway 31 and the second sleeve portion 36 is distally located with respect to the tapered cavity 20 in the passageway 31. The second sleeve portion 36 forms a cylindrical third channel portion 40. No insulating sleeve exists between the bottom of the first sleeve portion 32 and the top of the second sleeve portion 36; hence, the internal wall portion 30 defines a fourth channel portion 42. The first, second, fourth, and third channel portions 28, 34, 42 and 40 respectively form a channel 44 connecting with and extending from the tapered cavity 20 to the bottom 38. The ledge 24, first internal wall portion 26, first channel portion 28, second internal wall portion 30, passageway 31, first sleeve portion 32, second channel portion 34, second sleeve portion 36, third channel portion 40, fourth channel portion 42, and channel 44 may be centered on the common center axis 22.

The test probe 10 includes a center probe pin 50 which is supported by the housing 14. As shown in FIG. 1, the center probe pin 50 in part is located in the tapered cavity 20 and in part is located in the channel 44. More specifically, the test probe 10 has a movable pin tip portion 52 (i.e., probe contact) and a rigidly mounted pin base portion 54, both being coaxially aligned with the center axis 22. The movable pin tip portion 52 is slidingly mounted in the first sleeve portion 32 and the pin base portion 54 is rigidly mounted in the second sleeve portion 36. A spring mechanism in the form a helical spring 56 is connected at a first end 58 to the pin base portion 54 and at the other end 60 to the pin tip portion 52. The pin tip portion 52 is upwardly biased by the helical spring 56, i.e., the pin tip portion 52 is spring-loaded. When the pin tip portion 52 is not engaged by a coaxial connector (not shown in FIG. 1), the pin tip portion 52 is located in a first position wherein the pin tip portion 52 is disposed in a spaced-apart relationship with the pin base portion 54, as shown by a gap 62 in FIG. 1. In this first position, the upper end of the pin tip portion 52 protrudes upwardly into the tapered cavity 20.

The housing body 15 may include a second housing end portion 64 which is oppositely disposed to, and integrally formed with, the first housing end portion 16. The second housing end portion 64 may include a plurality of externally positioned threads 66, such threads 66 allowing for the test probe 10 to be removably attached to the test fixture (not shown). Such threads 66 may comprise Subminiature Type A (SMA) connector threads commonly used for small outline, coaxial connectors, such as those connectors used in VHF, UHF, and microwave RF applications. A circular stop or band 68 is formed above the threads 66 to stop the coaxial connector (see FIG. 2). Hence, the test probe 10 may be readily removed for replacement purposes without taking apart the associated test fixture. Also, the threads 66 form part of the electrical path between the housing body 15 and electrical ground (not shown).

The housing body 15 (and therefore the first and second housing end portions 16 and 64) may be formed of a conductive material (e.g., metal) and may be coupled to electrical ground. Hence, electrical grounding is accomplished through the housing body 15 to the test fixture (see FIG. 2) which is coupled to the housing 15 by way of threads 66. Likewise, the pin tip portion 52 and the pin base portion 54 may be made of a conductive material (e.g., metal) and may be electrically connected to a source of test signals via the helical spring 56, which also may be made of a conductive material (e.g., metal). More specifically, a signal circuit providing a signal path for the test signals may be formed by the serial, electrical connection of the pin tip portion 52, the helical spring 56 and the pin base portion 54, with the pin base portion 54 in turn being coupled to the test fixture (see FIGS. 2 and 3). The pin tip portion 52 and pin base portion 54 are embedded in their respective sleeve portions 32 and 36 so as to be insulated from the housing body 15 and electrical ground.

Referring to FIG. 2, the coaxial connector 12 is shown mounted to a wireless device 13. The coaxial connector 12 may provide a RF port to the circuit of the wireless device 13 to be tested. In FIG. 2, the wireless device may be a mini-PCI WLAN card. There may be one or more such RF ports, with two being illustrated in the wireless device 13 shown in FIG. 2. The connector 12 may include a RF shielding ring conductor 72 (i.e., ground conductor), an inner wire signal conductor 74 (i.e., RF terminal) surrounded by the ring conductor 72, and a dielectric material 73 disposed between the conductors 72 and 74. Hence, there is a coaxial, concentric relationship between the two conductors 72 and 74 of the coaxial connector 12. The conductors 72 and 74 of the coaxial conductor 12 may define an operating impedance for the RF port of the wireless device 13. As explained hereinafter, the center tip portion of the test probe 10 electrically engages the signal conductor 74 and the grounded, tapered wall of the test probe 10 electrically engages the grounded ring conductor 72. Hence, the coaxial connector 12 may connect the wireless device 13 through the test probe 10 to the remainder of the test fixture, as will be described hereinafter.

Referring to FIGS. 1 and 2, the probe pin tip portion 52, which is spring biased by the helical spring 56 in a direction away from the pin base portion 54, is capable of longitudinal movement along the center axis 22 of the housing 14 toward the pin base portion 54 when engaged by the connector 12. In the illustrative case where WLAN cards are mounted for testing, the target coaxial connector 12 generally may vary in position from one card under test to the next card. To accommodate this variation in positioning, the top opening of the tapered cavity 20, adjacent to the inner perimeter of the ring-like surface 23, may have a diameter substantially larger than the ring conductor 72 of the coaxial connector 12. For example, the largest diameter of the tapered cavity may be 30% greater than the ring conductor 72. Consequently, when the test probe 10 is moved forward against the coaxial connector 12, the ring conductor 72 engages the tapered wall 18. Even though the center axis of the ring conductor 72 initially may be misaligned with respect to the center axis 22 of the center probe pin 50, as the ring conductor 72 slidingly moves further into the tapered cavity 20, the tapered wall 18 progressively aligns the center axis of the connector 12 with the center axis 22.

Initially, while in its first position, the pin tip portion 52 protrudes outward into the tapered cavity 20. As the ring conductor 72 progresses inwardly further along the tapered wall 18 in the above-described self centering process, the inner wire signal connector 74 of the coaxial connector 12 engages the movable pin tip portion 52 and inwardly biases (overcoming the spring bias of the helical spring 56) it toward the pin base portion 54. At the same time that the pin tip portion 52 is longitudinally displaced along the center axis 22 toward the pin base portion 54, the end portion 16 of the housing body 15 (and therefore the pin base portion 54) remains stationary relative to the pin tip portion 52. The pin tip portion 52 continues to move forward until the ring conductor 72 stops moving forward due to the narrowing of the diameter of the tapered cavity 20, at which point the ring conductor 72 may be centered on the center axis 22 of the probe 10. It should be noted that if pin tip portion 52 was rigidly fixed, instead of being movably mounted, it could engage the planar end of the coaxial connector 12, preventing the ring conductor 72 from ever engaging the tapered wall 18 so as to start or continue its self-centering process.

In summary, the pin tip portion 52 moves from its first position wherein it is disposed in a spaced-apart relationship with the pin base portion 54 to a second position wherein it is disposed in closer proximity with the pin base portion 54. In this second position, the pin tip portion 52 has moved toward the pin base portion 54 relative to its disposition in the first position. This self alignment or self centering feature of the test probe 10 may facilitate not only mating of the test probe 10 with the connector 12 which may be positioned at slightly different locations on the wireless device 13, but it also may account for differences in manufacturing tolerances in the connector 12.

The tapered ground formed by the tapered wall 18 may allow the test probe 10 to make better contact with the outer ground shielding ring conductor 72 on the coaxial connector 12 without having to be completely inserted into the test probe 10. This in turn may lower the voltage standing wave ratio (VSWR) of the test probe 10 and may provide better measurements. This may mean that the test probe 10 may account for mechanical errors in the outer ground shielding ring conductor 72 because of the tapering.

As this test probe 10 has only spring contact with the connector 12 and is not snapped onto the coaxial connectors as undertaken in the prior art, no metal is likely to be removed from the connector 12 during insertion or removal of the test probe 10. Hence, it is anticipated that the probe 10 may be inserted in the range of 60,000 insertions before it must be replaced.

Additionally, the test probe 10 is designed with replacement and manufacturing in mind. Even with the extended lifetime of the test probe 10, it has a finite life, i.e., a finite number of usage cycles it may endure prior to contact integrity degradation due to wear from contact with the target connectors. The test probe 10 may be easily and quickly replaced without disassembling the entire test fixture with which it is used.

In FIG. 2 a test fixture 75 is shown which may have mounted therein two test probes 10 and the wireless device 13 with the two coaxial connectors 12. Four components of the test fixture 75 are repeated in disassembled form in FIGS. 2A through 2D, with most of the reference numbers appearing in FIGS. 2A–2D. Referring to FIGS. 2 and 2A through 2D, the test fixture 75 may include a front panel 76 which aligns and mounts the probes 10 by way of a pair of RF probe adaptors 78 attached to the front panel 76. Each of the RF probe adaptors 78 may have an internal spring (not shown) and may float to provide movement in the XYZ axes. This mounting, i.e., being compliant in three axes, may help to position the probe 10 properly. The reason two probes 10 are shown in this illustrative embodiment is that there are two antenna ports (therefore two connectors 12) in this particular wireless device 13; hence, both ports may be tested do validate functionality during manufacturing tests. The test fixture 75 may be adapted to be used with wireless devices having any number of connectors 12.

In this illustrative example wherein the fixture 75 is a semi-automatic fixture, the wireless device 13 may be removably mounted in a card socket 82, e.g., a low-insertion force (LIF) socket. The RF probe adaptors 78 may connect the test probes 10 to a pair of coaxial cables 80. The cables 80 may pass through a block 81 with their other ends coupled to a data processing system (see FIG. 3). In this semi-automated fixture, the mounting of the wireless device 13 in the socket 82 may be used in a final test station. Alternatively, a fully automated fixture may be used on a functional test station, which may have a drawer where the wireless device 13 is placed. With the fully automated fixture, the operator may merely load the wireless device into a slot cutout, which may have three mounting pins that mate with the tooling holes on the card of the wireless device 13. After the mounting step, at the command of the operator, the fixtures in both the semi-automated and automated embodiments, may automatically cause the probes 10 to be inserted into the board of the wireless device 13.

In the fixture 75, for the probes 10 to engage the connectors 12, the panel 76 (and therefore the probes 10) may be operable for sliding movement toward the wireless device 13 as shown by arrow 83, or the socket 82 (and therefore the wireless device 13) may be operable for sliding movement toward the panel 76 as shown by arrow 84, or both may be capable of sliding movement toward each other. In the case of both being capable of movement, this may be accomplished in the fixture 75 in any number of ways, such as providing a pair of clamping members (not shown) attached, respectively, to the panel, 76 (and therefore the probes 10) and a back plate 87 with the socket 82 (and therefore the wireless device 13). These clamping members may ride on a rail (not shown) and an actuator (not shown) may cause the back plate 87 and the front panel 76 to move together at the same time. As they move together, the probes 10 make contact with the connectors 12 on the wireless device 13 and self align.

The block 81 may be mounted behind the probes 10 to receive the coaxial cables 80 via a pair of bore holes 88. The block 81 may be mounted in spaced-apart relationship to the panel 76 by a pair of rods 90. The block 81 may help to keep the probes 10 straight. Without this, the probes 10 may move according to the weight of the cables 80 and cause the probes 10 to not align. The cables 80 may have a pair of coaxial connectors 92 that mate with a pair of coaxial connectors 94 of the RF probe adaptors 78. Additionally, a pair of protruding stops 96 is mounted on the back plane 87 so as to provide the lateral support to the wireless device 13 board when the probes 10 engage the connectors 12, thereby preventing the board of the wireless device 13 from being bent by the contact of the probes 10. The panel 76, the block 81, and the back plate 87 may be made from blocks of plastic.

Figure 3:
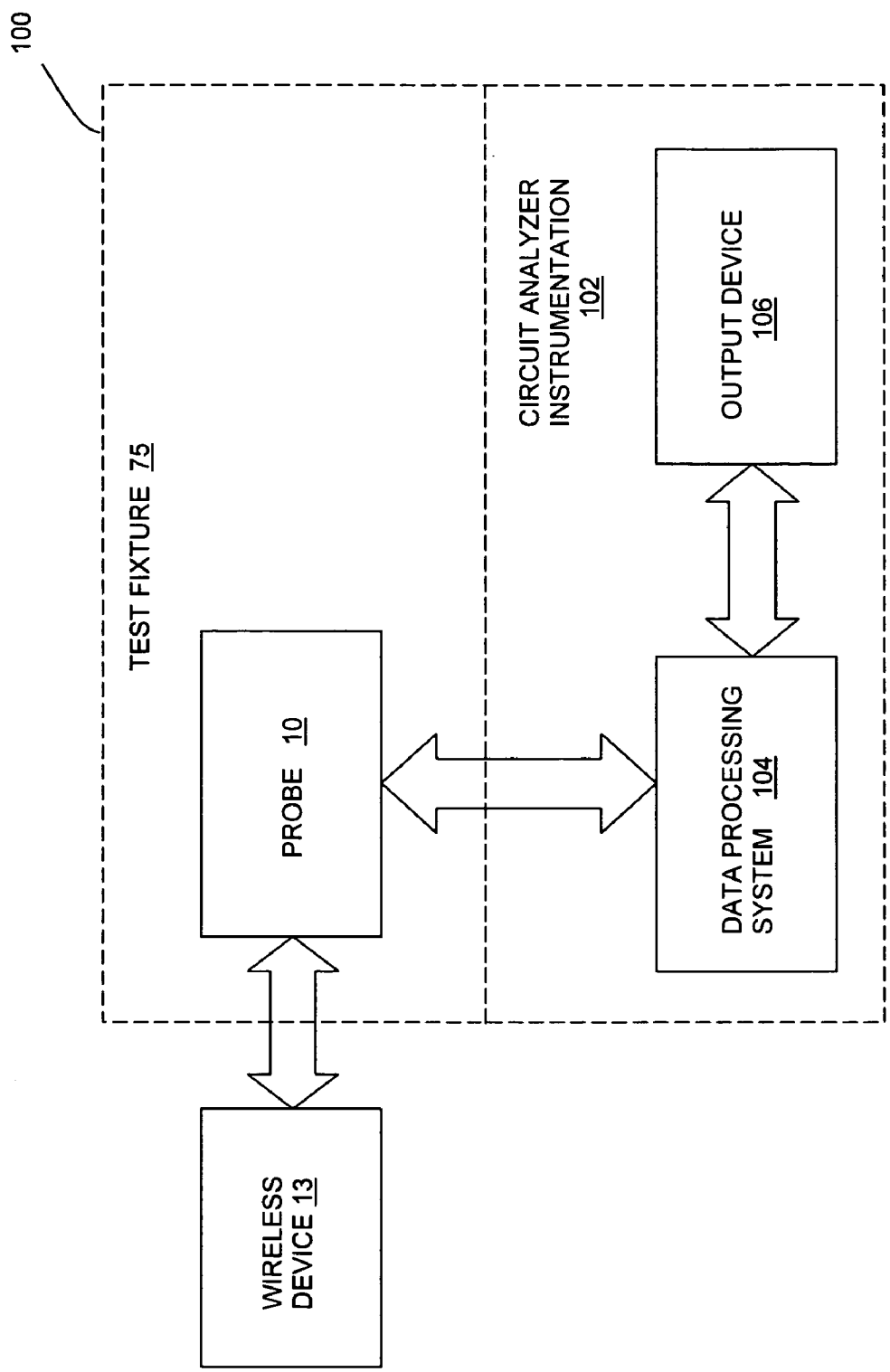
FIG. 3 is a block diagram of a system incorporating the test fixture of FIG. 2 in accordance to one embodiment of the present invention.

Referring to FIG. 3, there is shown one test system 100 in which the test probe 10, in accordance with one embodiment of the invention, may be used. The testing system 100 may include the test fixture 75 of FIG. 2. In one embodiment, the test fixture 75 may be a fully automated fixture used in functional tests of the wireless device 13, i.e., the test fixture 75 comprises a functional tester. In this embodiment, the test fixture 75 may connect to circuit analyzer instrumentation 102. The instrumentation 102 may include, for example, a power meter, a spectrum analyzer, power sources, RF switches and a reference card. The instrumentation 102 may also include a data processing system 104 with one or more output devices 106. During production runs, the test fixture 75 may quickly interface with each production unit, e.g., WLAN circuit boards of the wireless devices 13. The instrumentation 102 may be used to calibrate the wireless devices 13 under tests and insure functionally of the wireless devices 13.

In another embodiment, the test fixture 75 may be a semi-automatic fixture used in final tests of the wireless device 13. In this embodiment, the data processing system 104 of the system 100 may include one or two personal computers (PCs). The test fixture 75 may include an antenna box (not shown) and an access point for connecting to the test probe 10. The purpose of the final tests may be used to insure the wireless device 13 can communicate with an access point using drivers and firmware of the wireless device 13 before being shipping out to the customer.

FIGS. 4 through 7 illustrate a test probe 120 in accordance with another embodiment of the present invention. The test probe 120 may have a cylindrically-configured probe housing 121 with an outer housing body 122. The housing body 122 may be made of metal and may be coupled to an electrical ground. The housing body 122 may include a first end portion 124, which has an interior, round, inwardly-tapered wall 126 that defines a tapered cavity 127. The tapered wall 126 extends from a cylindrical internal wall 128 to a ring-shaped surface 129. The internal wall 128 forms a passageway 130 within the housing body 122, which extends from the tapered cavity 127 to the end of the test probe 120.

An insulating sleeve 132 may be positioned inside of the internal wall portion 128. The sleeve 132 includes an insulating first sleeve portion 134 and an insulating second sleeve portion 136. The first sleeve portion 134 extends from the tapered wall 126 to a position part way down the internal wall portion 128 in the passageway 130. The tapered wall 126 forms a conical ground shield. The second sleeve portion 136 also may be positioned inside of the internal wall portion 128, with the second sleeve portion 136 extending from a lower area of the test probe 120 to a position part way up the internal wall portion 128 in the passageway 130. The first sleeve portion 134 is proximally located with respect to the tapered cavity 127 and the second sleeve portion 136 is distally located with respect to the tapered cavity 127. The sleeve 132 may include a third sleeve portion 138, which may connect the first and second sleeve portions 134 and 136. The three sleeve portions form a single sleeve, the insulating sleeve 132. Although shown in cross-section as one piece in FIG. 5, the sleeve 132 may be assembled from two pieces attached to each other. The third sleeve portion 138 provides an enlarged, cylindrical, channel portion 140, which forms part of the passageway 130. The sleeve 132 is made of a dielectric material.

Figure 5:
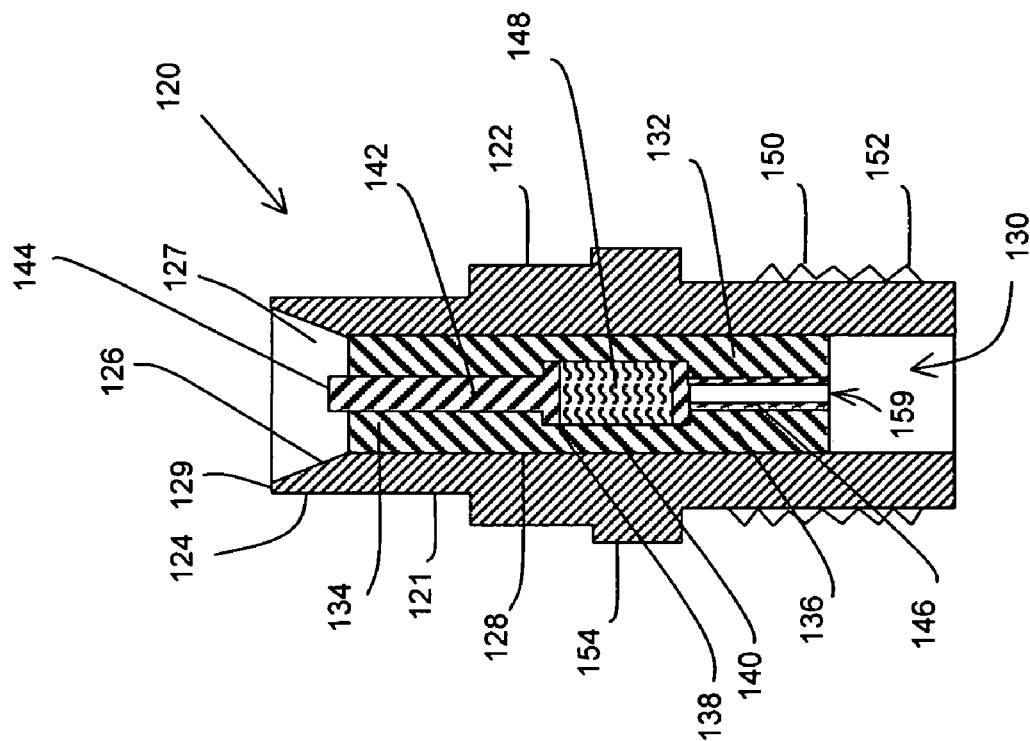
FIG. 5 is a cross-section view of the test probe taken with respect to sectional line 5—5 in FIG. 4.
Figure 4:
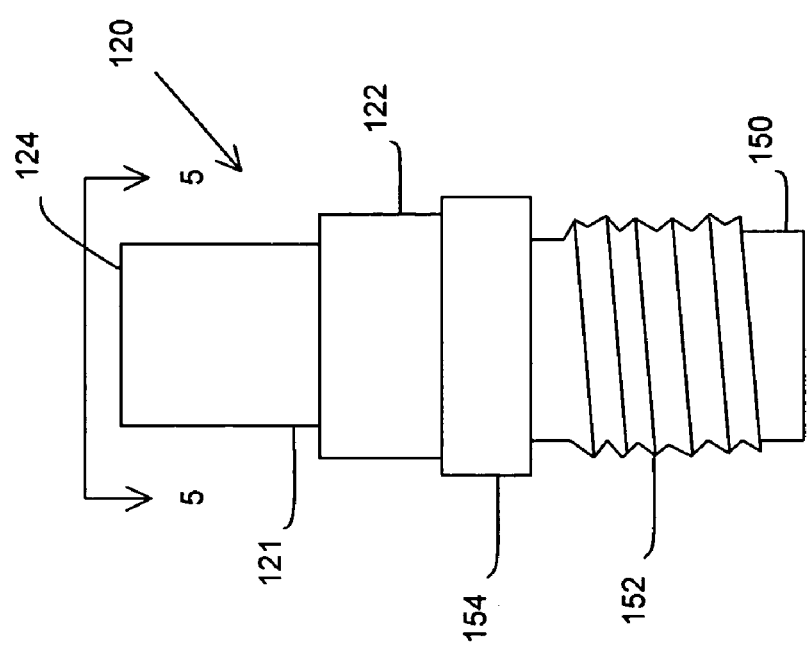
FIG. 4 is a side view of a test probe in accordance with another embodiment of the present invention.
Figure 6:
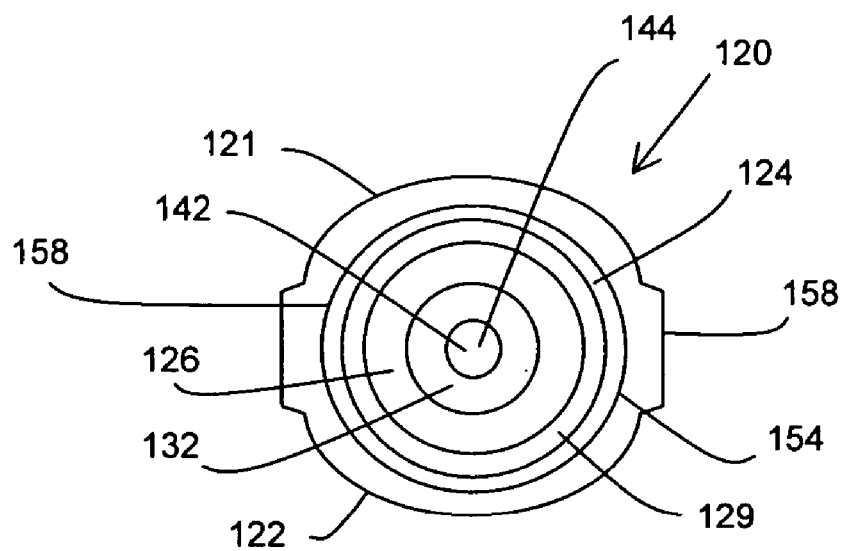
FIG. 6 is a top view of the test probe of FIG. 4.
Figure 7:
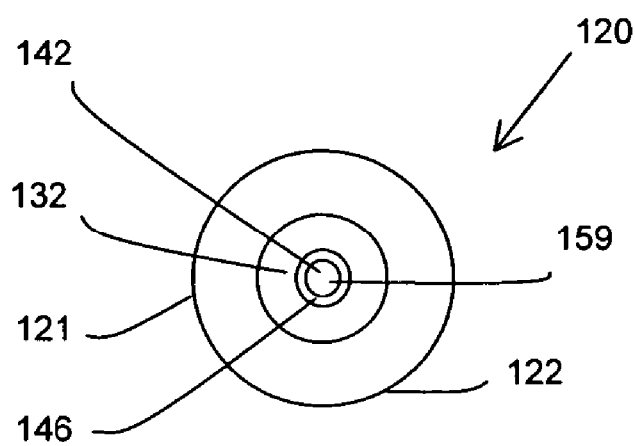
FIG. 7 is a bottom view of the test probe of FIG. 4.

The test probe 120 includes a center probe pin 142 which is supported by the housing 121. The test probe 120 has a movable pin tip portion 144 and a rigidly mounted pin base portion 146. The pin tip portion 144 and the pin base portion 146 transmit test signals. The movable pin tip portion 144 is slidingly mounted in the first sleeve portion 134 and the pin base portion 146 is rigidly mounted in the second sleeve portion 136. A spring mechanism in the form a helical spring 148 at a first end engages the pin base portion 146 and at the other end engages the pin tip portion 144. The pin tip portion 144 is spring loaded, i.e., the pin tip portion 144 is upwardly biased by the helical spring 148. The spring 148 is contained within the channel portion 140 between the pin tip portion 144 and the pin base portion 146. As illustrated in FIG. 5, when the pin tip portion 144 is not engaged by a coaxial connector (not shown), the pin tip portion 144 is located in a first position wherein the pin tip portion 144 is disposed in a spaced-apart relationship with the pin base portion 146. In this first position, the upper end of the pin tip portion 144 protrudes upwardly into the tapered cavity 127.

The housing body 122 includes a second housing end portion 150 which may include a plurality of externally positioned threads 152, such threads 152 allowing for the test probe 120 to be removably attached to the test fixture (not shown). A circular stop 154 is formed above the threads 152. The threads 152 form part of the electrical path between the housing body 122 and electrical ground of the test fixture.

The housing body 122 (and therefore the first and second housing end portions 124 and 150) may be formed of a conductive material (e.g., metal) and may be coupled to electrical ground. Hence, grounding is accomplished through the housing body 122 to the test fixture via the threads 152. Likewise, the pin tip portion 144, helical spring 148, and pin base portion 146 may be made of a conductive material (e.g., metal) so as to form a signal circuit electrically connected to a source of test signals via the test fixture. To accomplish this, one end of the helical spring 148 may electrically engage the pin tip portion 144 and the other end may electrically engage the pin base portion 146.

The top of the housing body 122 may have a pair of opposed flats 158 to allow for wrench tightening. The pin base portion 146 includes an aperture 159 forming a socket for receiving a pin (not shown) for connecting to the test fixture. Use and operation of the test probe 120 in the test fixture is the same as that described for the test probe 10 of FIG. 1.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is manifestly intended that this invention be limited only by the claims and the equivalents thereof.

What is claimed is:

1. An apparatus, comprising:
   a housing including a first housing end portion having a surface and a round tapered wall formed within the first housing end portion and configured to progressively expand toward and terminate on the surface, with the tapered wall defining a tapered cavity with a substantially circular opening in the surface;
   a probe pin having a pin base portion rigidly mounted to the housing and a pin tip portion movably mounted to the housing for movement between a first position wherein the pin tip portion is disposed in a spaced-apart relationship with the pin base portion and protrudes into the tapered cavity, and a second position wherein the pin tip portion is moved toward the pin base portion relative to the first position; and
   the tapered cavity being configured and dimensioned to receive a coaxial connector, with a diameter of the substantially circular opening being greater than a diameter of the coaxial connector.

2. The apparatus according to claim 1, further comprising a spring mechanism mounted between the pin tip portion and the pin base portion.

3. The apparatus according to claim 2, wherein the housing includes an internal wall defining a passageway that opens at one end into the tapered cavity; the pin base portion and at least a part of the pin tip portion being disposed in the passageway in spaced-apart relationship to the internal wall.

4. The apparatus according to claim 3, wherein the housing includes an insulating first sleeve portion disposed within the passageway and proximally located to the tapered cavity and an insulating second sleeve portion disposed within the passageway and distally located to the tapered cavity; the pin tip portion is slidingly mounted within the first sleeve portion; and the pin base portion is rigidly mounted in the second sleeve portion.

5. The apparatus according to claim 4, wherein the spring mechanism includes a helical spring having a first and a second spring end with the first spring end being disposed to engage the pin base portion and the second spring end being disposed to engage the pin tip portion.

6. The apparatus according to claim 5, wherein the housing includes a second housing end portion integrally formed with the first housing end portion to define a housing body; the second housing end portion having a plurality of threads; the housing body being formed of a conductive material; and the housing body being coupled to electrical ground through the plurality of threads.

7. The apparatus according to claim 4, wherein the pin tip portion, the helical spring, and the pin base portion are made of a conductive material; and a signal circuit is formed by the pin tip portion, the helical spring and the base portion with the base pin tip portion being electrically coupled to the first spring end of the helical spring and the second spring end of the helical spring being electrically coupled to the pin tip portion.

8. The apparatus according to claim 7, wherein the housing has a center axis; and the pin base portion; the pin tip portion, the tapered cavity, and the passageway are substantially centered on the center axis.

9. The apparatus according to claim 1, wherein the tapered cavity has a conical frustum configuration.

10. The apparatus according to claim 1, further comprising a coaxial cable having an outer shielding ring conductor; an inner conductor surrounded by the shielding ring conductor; and a dielectric interposed between the shielding ring conductor and the inner conductor; and wherein the diameter of the shielding ring conductor is substantially less than the largest diameter of the tapered cavity; and the tapered wall is configured to slidingly engage the outer shielding ring conductor so as to align the pin tip portion with the inner conductor.

11. The apparatus according to claim 1, wherein the tapered cavity is further configured and dimensioned to have a diameter at an end opposite to the substantially circular opening which is less than the diameter of the coaxial connector.

12. The apparatus according to claim 11, wherein the housing has a center axis; the pin base portion; the pin tip portion, and the tapered wall are substantially centered on the center axis; and the substantially circular opening in the surface is substantially perpendicular to the center axis.

13. The apparatus of claim 12, wherein the surface has a ring-like configuration disposed in a substantially perpendicular relationship with the center axis.

* * * * *

UNITED STATES PATENT AND TRADEMARK OFFICE
CERTIFICATE OF CORRECTION

PATENT NO. : 7,053,643 B2  Page 1 of 1
APPLICATION NO. : 10/811128
DATED : May 30, 2006
INVENTOR(S) : Ruff et al.

Figure 2B:
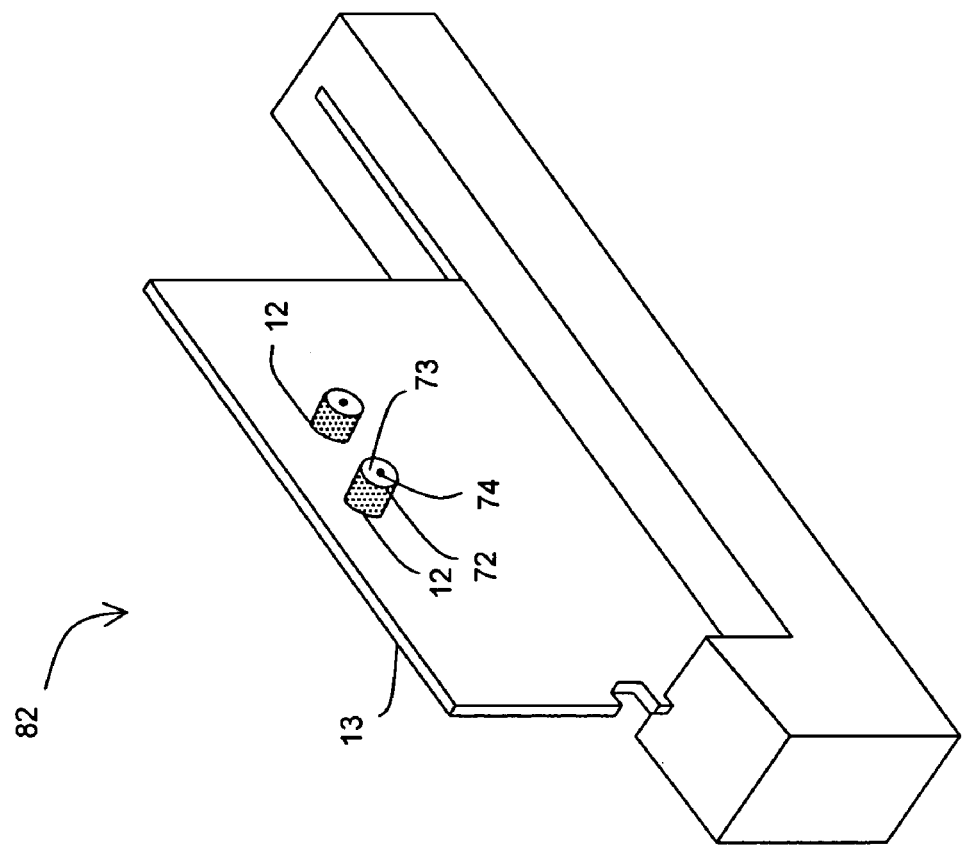
FIGS. 2A through 2B show the disassembled components of the test fixture of FIG. 2 in perspective views.
Figure 2A:
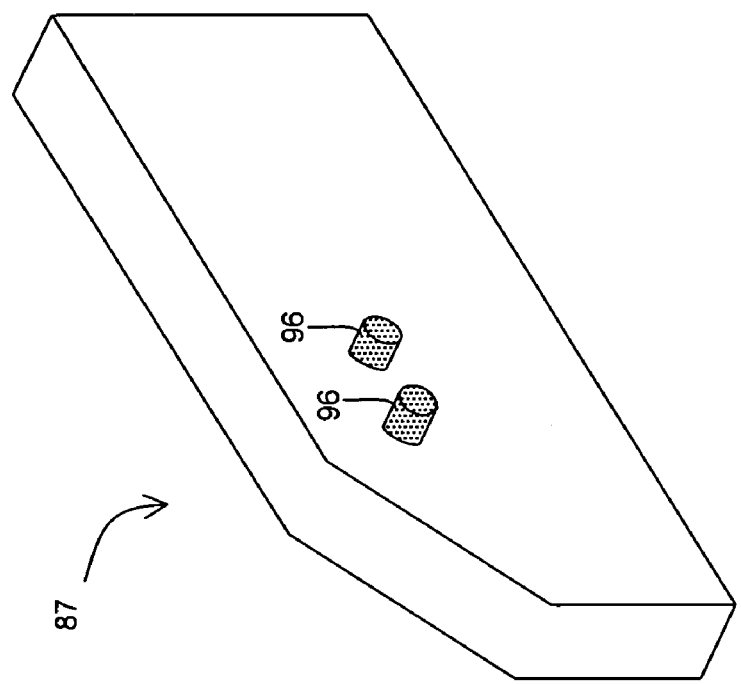
Figures 2C, 2D:
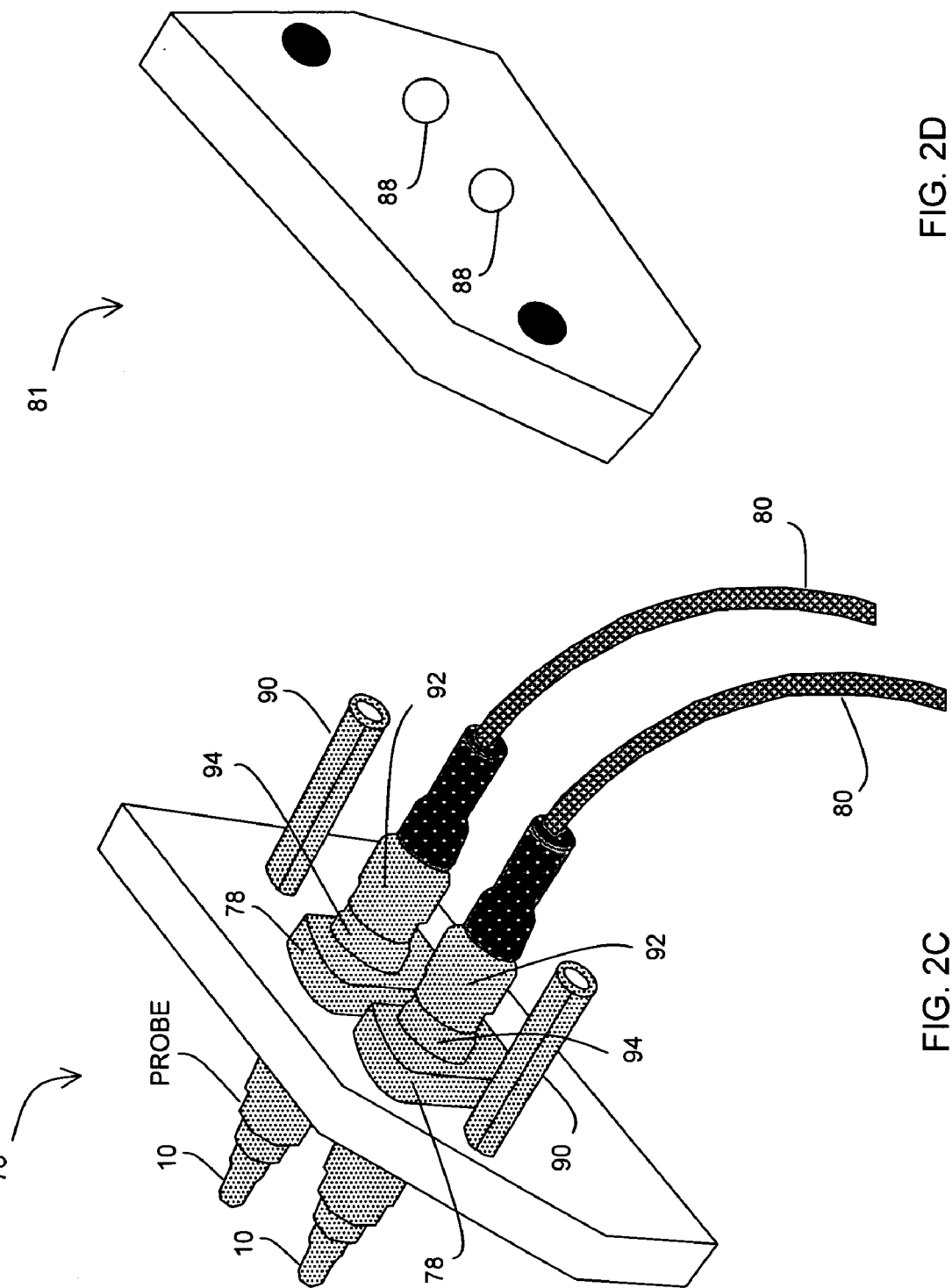

It is certified that error appears in the above-identified patent and that said Letters Patent is hereby corrected as shown below:

Column 1
Line 46, "...FIGS. 2A through 2B..." should read --...FIGS. 2A through 2D...--.

Column 3
Line 57, "...housing 15..." should read --...housing body 15.--.

Column 4
Line 17, "...coaxial conductor 12..." should read --...coaxial connector 12...--.

Column 6
Line 20, "...panel, 76..." should read --...panel 76...--.

Signed and Sealed this

Twenty-seventh Day of May, 2008

JON W. DUDAS
*Director of the United States Patent and Trademark Office*